(12) United States Patent
Bera et al.

(10) Patent No.: US 9,696,097 B2
(45) Date of Patent: Jul. 4, 2017

(54) MULTI-SUBSTRATE THERMAL MANAGEMENT APPARATUS

(71) Applicant: APPLIED MATERIALS, INC., Santa Clara, CA (US)

(72) Inventors: Kallol Bera, San Jose, CA (US); Kim Vellore, San Jose, CA (US); Andrew Constant, Cupertino, CA (US); Jacob Newman, Palo Alto, CA (US); Jeffrey Blahnik, Leander, TX (US); Jason Schaller, Austin, TX (US); William Weaver, Austin, TX (US); Robert Vopat, Austin, TX (US); Benjamin Riordon, Newburyport, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 273 days.

(21) Appl. No.: 14/504,021

(22) Filed: Oct. 1, 2014

(65) Prior Publication Data

US 2016/0033205 A1 Feb. 4, 2016

Related U.S. Application Data

(60) Provisional application No. 62/032,322, filed on Aug. 1, 2014.

(51) Int. Cl.
*E21B 27/00* (2006.01)
*F28F 3/12* (2006.01)
(Continued)

(52) U.S. Cl.
CPC .......... *F28F 3/12* (2013.01); *H01L 21/67109* (2013.01); *H01L 21/67303* (2013.01)

(58) Field of Classification Search
CPC ...... F28D 9/0062; F28D 9/0093; F26B 3/286; B08B 5/00; B21J 5/066
(Continued)

(56) References Cited

U.S. PATENT DOCUMENTS 3,540,531 A * 11/1970 Becker ...................... F25J 5/002
165/166
4,526,635 A * 7/1985 Heinrich ................. F28F 21/04
156/245

(Continued)

FOREIGN PATENT DOCUMENTS

KR 10-2004-0064585 7/2004

OTHER PUBLICATIONS

International Search Report and Written Opinion mailed Oct. 26, 2015 for PCT Application No. PCT/US2015/042852.

*Primary Examiner* — Davis Hwu
(74) *Attorney, Agent, or Firm* — Moser Taboada; Alan Taboada

(57) ABSTRACT

Embodiments of multi-substrate thermal management apparatus are provided herein. In some embodiments, a multi-substrate thermal management apparatus includes a plurality of plates vertically arranged above one another; a plurality of channels extending through each of the plurality of plates; a supply manifold including a supply channel coupled to the plurality of plates at first locations; and a return manifold including a return channel coupled to the plurality of plates via a plurality of legs at second locations, wherein the supply and return channels are fluidly coupled to the plurality of channels to flow a heat transfer fluid through the plurality of plates.

18 Claims, 4 Drawing Sheets

(51) Int. Cl.
*H01L 21/67* (2006.01)
*H01L 21/673* (2006.01)

(58) Field of Classification Search
USPC .......................................... 165/166, 167, 176
See application file for complete search history.

(56) References Cited

U.S. PATENT DOCUMENTS

| | | |
|---|---|---|
| 5,882,413 A | 3/1999 | Beaulieu et al. |
| 7,343,965 B2 * | 3/2008 | Memory ................ F28D 9/005 |
| | | 165/166 |
| 2001/0017192 A1 | 8/2001 | Hwang et al. |
| 2005/0072716 A1 | 4/2005 | Quiles et al. |
| 2006/0169210 A1 | 8/2006 | Inagawa et al. |
| 2015/0168075 A1 * | 6/2015 | Bertilsson ................ B21J 5/066 |
| | | 165/166 |
| 2015/0204606 A1 | 7/2015 | Kutney |

* cited by examiner

MULTI-SUBSTRATE THERMAL MANAGEMENT APPARATUS

CROSS-REFERENCE TO RELATED APPLICATIONS

This application claims benefit of U.S. provisional patent application Ser. No. 62/032,322, filed Aug. 1, 2014, which is herein incorporated by reference in its entirety.

FIELD

Embodiments of the present disclosure generally relate to substrate processing equipment.

BACKGROUND

Films disposed on a substrate are often deposited at high temperatures. Thus, finished substrates at elevated temperatures are sensitive to oxygen exposure when they are removed from a process chamber. Therefore, finished substrates are typically cooled to at or near room temperature to minimize substrate sensitivity to oxygen exposure.

Currently, in some substrate processing systems, passive cooling methods are used to simultaneously cool a plurality of processed substrates. However, the passive cooling method takes about 5-10 minutes to reduce the temperature of the substrates below 30° C. (e.g., about room temperature). Thus, the throughput of the processing system is significantly reduced. Alternatively, in some processing systems active cooling apparatus is used to cool processed substrates. However, such apparatus only cool one substrate at a time, which also reduces throughput of the processing system. Furthermore, the active cooling apparatus are still not capable of quickly cooling a processed substrate to at or near room temperature.

Therefore, the inventors have provided an improved multi-substrate thermal management apparatus for use with integrated fabrication systems.

SUMMARY

Embodiments of methods and apparatus for processing a substrate are provided herein. In some embodiments, a multi-substrate thermal management apparatus includes a plurality of plates vertically arranged above one another; a plurality of channels extending through each of the plurality of plates; a supply manifold including a supply channel coupled to the plurality of plates at first locations; and a return manifold including a return channel coupled to the plurality of plates via a plurality of legs at second locations, wherein the supply and return channels are fluidly coupled to the plurality of channels to flow a heat transfer fluid through the plurality of plates.

In some embodiments, an apparatus for processing a substrate includes a factory interface for interfacing with a substrate processing platform, the factory interface including a docking station and a factory interface robot to facilitate transfer of substrates from the factory interface to the substrate processing platform; a multi-substrate thermal management apparatus disposed between the factory interface and the substrate processing platform such that the factory interface robot can place substrate into or remove substrates from the multi-substrate thermal management apparatus; and a heat transfer fluid supply coupled to the multi-substrate thermal management apparatus to provide a heat transfer fluid to the multi-substrate thermal management apparatus. The multi-substrate thermal management apparatus includes a plurality of plates vertically arranged above one another; a plurality of channels extending through each of the plurality of plates; a supply manifold including a supply channel coupled to the plurality of plates at first locations; and a return manifold including a return channel coupled to the plurality of plates via a plurality of legs at second locations, wherein the supply and return channels are fluidly coupled to the plurality of channels to flow a heat transfer fluid through the plurality of plates.

In some embodiments, a multi-substrate thermal management apparatus includes a plurality of plates vertically arranged above one another, wherein each of the plurality of plates includes 41 contact elements equally distributed on an upper surface to support a substrate thereon; a plurality of channels extending through each of the plurality of plates; a supply manifold including a supply channel coupled to the plurality of plates at first locations; and a return manifold including a return channel coupled to the plurality of plates via a plurality of legs at second locations, wherein diameters of the plurality of channels in the plurality of legs decrease from an uppermost leg to a lowermost leg, and wherein the supply and return channels are fluidly coupled to the plurality of channels to flow a heat transfer fluid through the plurality of plates.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
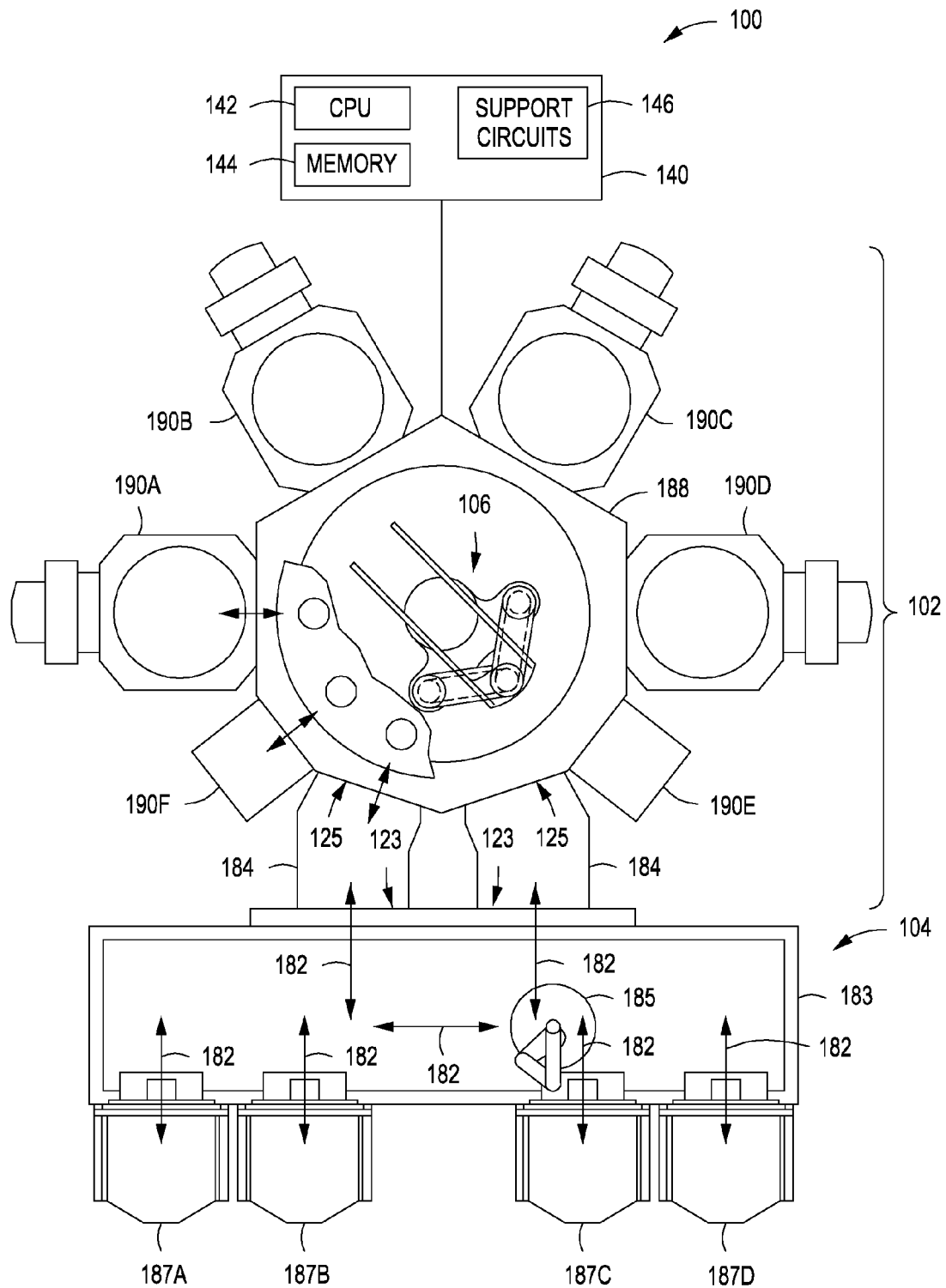
FIG. 1 is schematic view of a processing system having a multi-substrate thermal management apparatus in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure generally relate to multi-substrate thermal management apparatus for use in integrated substrate fabrication systems. Embodiments of the inventive multi-substrate thermal management apparatus advantageously mount directly to a factory interface (FI) of a substrate processing tool and cools or heats a plurality of substrates simultaneously, thus increasing throughput of the substrate processing tool while minimizing any negative impact on the floor space occupied by the substrate processing tool.

FIG. 1 is a schematic top-view diagram of an exemplary multi-chamber processing system 100 that may be suitable for use with the present inventive apparatus disclosed herein. Examples of suitable multi-chamber processing systems that may be suitably modified in accordance with the teachings provided herein include the ENDURA®, CENTURA®, and PRODUCER® processing systems or other suitable processing systems commercially available from Applied Materials, Inc., located in Santa Clara, Calif. It is contemplated that other processing systems (including those from other manufacturers) may be adapted to benefit from the present disclosure.

In some embodiments, the multi-chamber processing system 100 may generally comprise a vacuum-tight processing platform 102, a factory interface 104, and a system controller 140. The processing platform 102 may include a plurality of process chambers 190A-F and at least one load-lock chamber 184 (two shown) that are coupled to a transfer chamber 188. A transfer robot 106 (described below with respect to FIGS. 2 and 3) is centrally disposed in the transfer chamber 188 to transfer substrates between the load lock chambers 184 and the process chambers 190A-F. The process chambers 190A-F may be configured to perform various functions including layer deposition including atomic layer deposition (ALD), chemical vapor deposition (CVD), physical vapor deposition (PVD), etch, pre-clean, de-gas, orientation and center-finding, annealing, and other substrate processes Each of the process chambers 190A-F may include a slit valve or other selectively sealable opening to selectively fluidly couple the respective inner volumes of the process chambers 190A-F to the inner volume of the transfer chamber 188. Similarly, each load lock chamber 184 may include a port to selectively fluidly couple the respective inner volumes of the load lock chambers 184 to the inner volume of the transfer chamber 188.

The factory interface 104 is coupled to the transfer chamber 188 via the load lock chambers 184. In some embodiments, each of the load lock chambers 184 may include a first port 123 coupled to the factory interface 104 and a second port 125 coupled to the transfer chamber 188. The load lock chambers 184 may be coupled to a pressure control system which pumps down and vents the load lock chambers 184 to facilitate passing the substrate between the vacuum environment of the transfer chamber 188 and the substantially ambient (e.g., atmospheric) environment of the factory interface 104.

In some embodiments, the factory interface 104 comprises at least one docking station 183 and at least one factory interface robot 185 (one shown) to facilitate transfer of substrates from the factory interface 104 to the processing platform 102 for processing through the load lock chambers 184. The docking station 183 is configured to accept one or more (four shown) front opening unified pods (FOUPs) 187A-D. Optionally, one or more metrology stations (not shown) may be coupled to the factory interface 104 to facilitate measurement of the substrate from the FOUPs 187A-D. The factory interface robot 185 disposed in the factory interface 104 is capable of linear and rotational movement (arrows 182) to shuttle cassettes of substrates between the load lock chambers 184 and the one or more FOUPs 187A-D.

In some embodiments, the inventive multi-substrate thermal management apparatus is disposed in a load lock chamber 184 to facilitate conditioning (e.g., heating or cooling) one or more substrates prior to transferring the one or more substrates between the processing platform 102 and the factory interface 104. For example, in some embodiments, the multi-substrate thermal management apparatus may be used to cool one or more processed substrates prior to removal from the processing platform 102 and exposure to the ambient environment of the docking station 183. Alternatively, the multi-substrate thermal management apparatus may be coupled to the docking station 183 in place of one of the FOUPs 187A-D or at another location on the factory interface 104.

Figure 2:
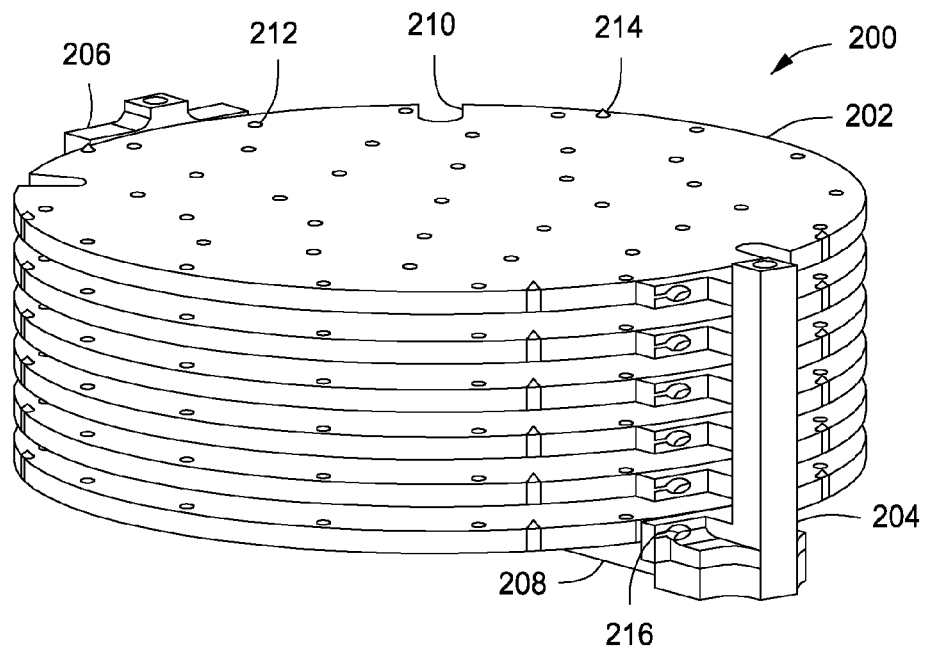
FIG. 2 is an isometric view of a multi-substrate thermal management apparatus in accordance with some embodiments of the present disclosure.

FIG. 2 depicts a multi-substrate thermal management apparatus 200 according to some embodiments of the present disclosure. The multi-substrate thermal management apparatus 200 includes a plurality of plates 202 (6 shown) used to cool a substrate when placed thereon. The plates are vertically arranged above one another. A thickness of each of the plates 202 may be between about 0.38 inches and 0.5 inches. In some embodiments, the number of plates 202 corresponds to the number of process chambers 190. The plates 202 may be fabricated from any material with high thermal conductivity (e.g., aluminum).

A supply manifold 204 is coupled to the plates 202 at a first location to provide a heat transfer fluid from a heat transfer fluid supply (e.g., 318 depicted in FIG. 3) to each of the plates 202. A return manifold 206 is coupled to the 202 at a second location to remove the a heat transfer fluid from each of the plates 202 to be returned to the heat transfer fluid source. In the embodiment shown in FIG. 2, the first location and the second location are disposed on opposite sides of the plurality of plates 202. In some embodiments, the supply and return manifolds 204, 206 are coupled to a supply/return block 208 through which the heat transfer fluid flows to the supply manifold 204 and from the return manifold 206. The supply and return manifolds 204, 206 may be coupled to the plates 202 using fixation elements 216 such as, for example, screws.

Each of the plates 202 includes a plurality of notches 210 disposed through the plates 202. The plurality of notches 210 are disposed at a periphery of the plates 202 and allow a lift assembly (shown in FIG. 5) to pass therethrough to lift substrates off or lower a substrate onto the plates 202.

Each of the plates 202 includes a plurality of contact elements 212 disposed on an upper surface of the respective plates 202. The substrates, when placed atop the plates 202, rest on the plurality of contact elements 212. The contact elements 212 are formed of a material that can withstand the high temperature of the substrates while preventing particle generation on a backside thereof. In some embodiments, the contact elements 212 may be formed of silicon nitride (SiN).

The inventors have observed that the positions and number of contact elements 212 may cause or prevent deformation of the substrate during rapid cooling or heating. Additionally, the positions and number of contact elements also affect the cooling/heating uniformity of the substrate. Therefore, the inventors have discovered that an equal distribution of contact elements 212 about the plate 202 ensures optimal cooling/heating uniformity. In some embodiments, the number of contact elements 212 may be 41. However, the number of contact elements 212 may alternatively be greater or less. To further improve the cooling/heating time and uniformity, the contact elements 212 are positioned close to an upper surface of the plates 202. In some embodiments, the contact elements have a height of about 0.007 inches above the upper surface of each plate 202. As used herein, the term about means within 10 percent of the nominal value. A subset of the contact elements 212 are disposed within about 5 mm from a diameter of a substrate to be placed thereon (e.g., 150 mm, 200 mm, 300 mm 450 mm or the like) to further improve the cooling/heating performance of the plate 202. In some embodiments, a plurality of pins 214 may be disposed on the plate 202 outside a diameter of a substrate to be placed on the plate 202 to prevent sliding of the substrate. The pins 214 are formed of a material that can withstand operating temperatures and causes little to no damage to the substrate upon contact. For example, the pins 214 may be formed of quartz.

Figure 3:
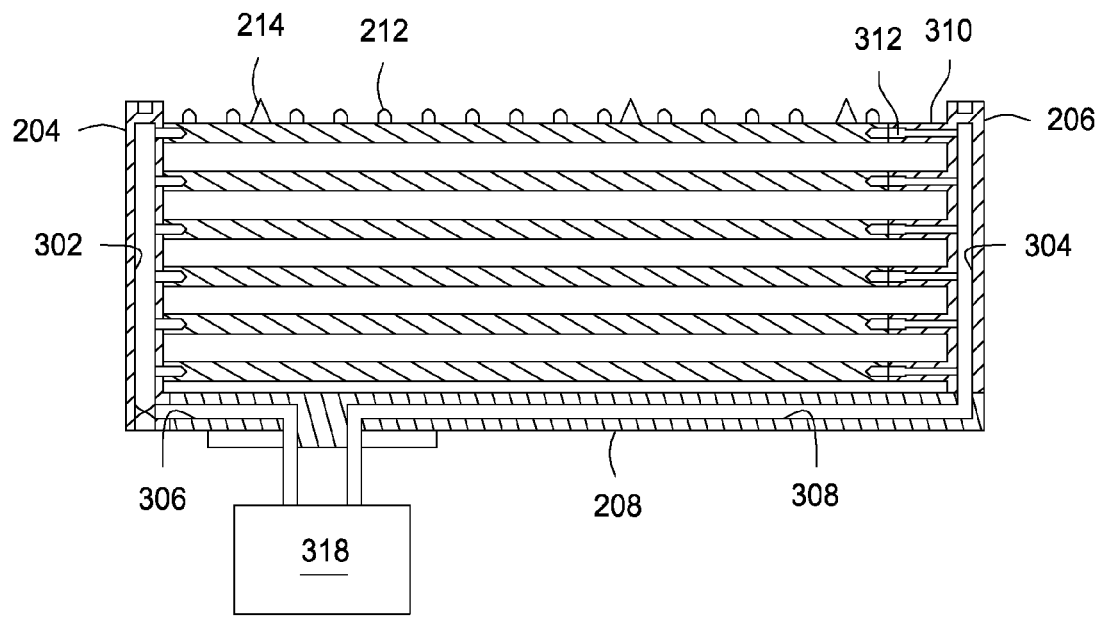
FIG. 3 is a cross-sectional view of a multi-substrate thermal management apparatus in accordance with some embodiments of the present disclosure.

FIG. 3 depicts a cross-sectional view of the multi-substrate thermal management apparatus 200 in accordance with some embodiments of the present disclosure. As depicted in FIG. 3, the supply manifold 204 includes a supply channel 302 that is fluidly coupled to a first channel 306 in the supply/return block 208. The return manifold 206 includes a return channel 304 that is fluidly coupled to a second channel 308 in the supply/return block 208. The return manifold 206 also includes a plurality of legs 310 that couple the return manifold 206 to the plates 202. The legs 310 each include a channel 312 that is fluidly coupled to a plurality of channels 402 (discussed below with respect to FIG. 4) in the plates 202 at one end and the return channel 304 at the other end. To facilitate heat transfer of substrates placed atop the plates 202, heat transfer fluid is supplied to the supply/return block 208 from a heat transfer fluid supply 318.

The heat transfer fluid flows through the first channel 306 and, subsequently, the supply channel 302. The heat transfer fluid is then distributed to the plurality of channels 402 in each of the plates 202. Afterwards, the heated/cooled heat transfer fluid flows through the plurality of channels 312, the return channel 304, and, finally, the second channel 308. In some embodiments, substantially equal flow is provided through each of the plates 202 to advantageously provide substantially equal rate of temperature change on all substrates placed on the plates 202. For example, in some embodiments, the diameters of the plurality of channels 312 may decrease from the furthest plate 202 from the heat transfer fluid supply 318 (i.e., an uppermost leg 310) to the nearest plate 202 to the heat transfer fluid supply 318 (i.e., a lowermost leg 310). For example, in some embodiments, the diameters of the plurality of channels 312 vary from about 0.1875 inches at the top plate to about 0.1495 inches at the bottom plate. However, the diameters of the plurality of channels 312 may be varied in any manner to provide substantially equal flow of the heat transfer fluid through the plates 202. As used herein, the term substantially equivalent, or substantially equal, means a smaller value is within about 10 percent of a larger value. The terms substantially equivalent or substantially equal, as defined above, may be used to describe other aspects of the disclosure, such as conduit (or channel) length, flow length, cross-sectional area, flow rate, or the like.

Figure 4:
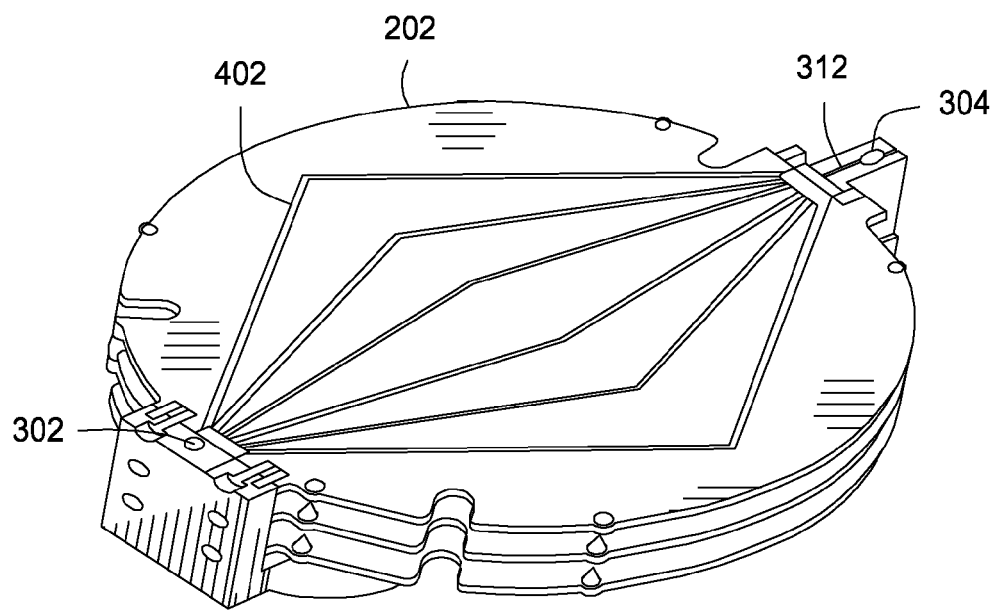
FIG. 4 is an isometric view of a multi-substrate thermal management apparatus in accordance with some embodiments of the present disclosure.

FIG. 4 depicts an isometric view of a portion of a multi-substrate thermal management apparatus detailing a partial cutaway of one of the plates 202 in accordance with some embodiments of the present disclosure. As depicted in FIG. 4, each plate 202 includes a plurality of channels 402 disposed through the plate 202 and extending from the supply channel 302 to the channel 312. In some embodiments, a manifold may be provided at respective ends of the channels 402 to facilitate fluidly coupling the plurality of channels 402 to the supply channel 302 and the channel 312. The plurality of channels 402 have a fluid conductance (length and diameter) sufficient to maintain a desired flow of the heat transfer fluid through each plate 202. For example, in some embodiments, the plurality of channels 402 have a fluid conductance (length and diameter) sufficient to flow at least 0.5 gallons per minute (gpm) of heat transfer fluid through the plate 202.

Figure 5:
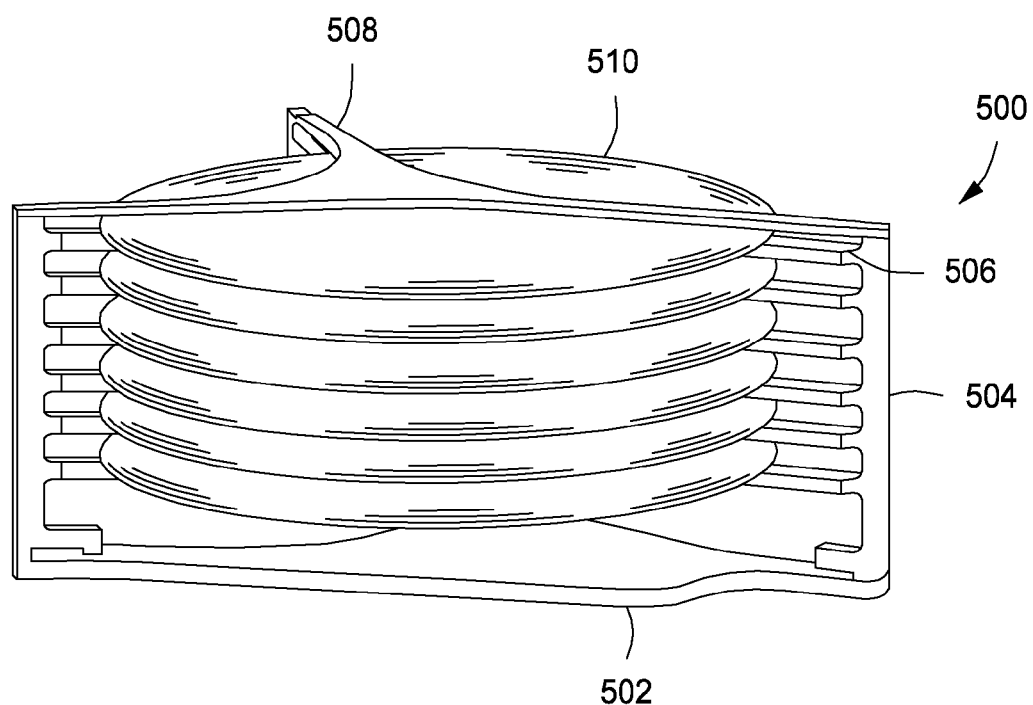
FIG. 5 is an isometric view of a lift apparatus suitable for use with a multi-substrate thermal management apparatus in accordance with some embodiments of the present disclosure.

FIG. 5 depicts a lift assembly 500 suitable for use with the multi-substrate thermal management apparatus 200. The lift assembly 500 includes a base 502 and a plurality of arms 504 (three shown) extending upward from the base 502. Each of the plurality of arms 504 includes a plurality of prongs 506 that correspond to the number of plates 202. The plurality of prongs 506 are configured to fit within the notches 210 in each plate 202. The lift assembly 500 may be moved with respect to the plurality of plates 202 to selectively raise or lower substrates 510 off of or onto the plates 202. The lift assembly 500 also includes a reinforcing member 508 coupled to the plurality of arms 504 at an end opposite the base 502. The reinforcing member 508 facilitates maintaining the plurality of arms 504 in position.

Figure 6:
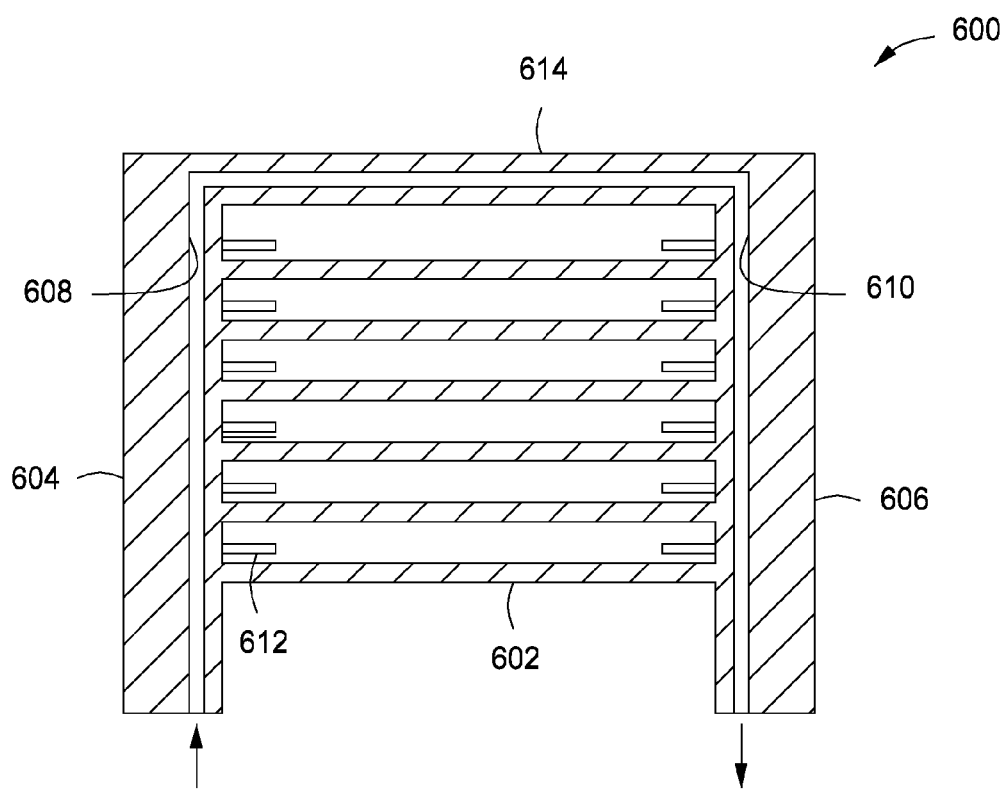
FIG. 6 is a side cross-sectional view of a multi-substrate thermal management apparatus in accordance with some embodiments of the present disclosure.

FIG. 6 depicts a multi-substrate thermal management apparatus 600 in accordance with some embodiments of the present disclosure. Like the multi-substrate thermal management apparatus 200, the multi-substrate thermal management apparatus 600 includes a plurality of plates 602, a supply manifold 604 including a supply channel 608, and a return manifold 606 including a return channel 610. Although not shown, each of the plurality of plates 602 may also include a plurality of contact elements and pins, as described above with respect to FIG. 2. In embodiments consistent with FIG. 6, the plates 602, the supply manifold 604, and the return manifold 606 are integrally formed from the same material. To simplify construction, a bridge portion 614 extends from the supply manifold 604 to the return manifold 606 above an uppermost plate of the plates 602. Another difference between the multi-substrate thermal management apparatus 200 and 600 is the absence of channels in the plates 602. The multi-substrate thermal management apparatus 600 cools/heats a plurality of substrates by flowing a heat transfer fluid through the supply manifold 604, the bridge portion 614, and the return manifold 606. Heat is transferred to/from the substrates through the plates 602 and to/from the heat transfer fluid flowing through the channels. As such, the multi-substrate thermal management apparatus 600 is formed of a material with a high thermal conductance such as, for example, aluminum.

Figure 7:
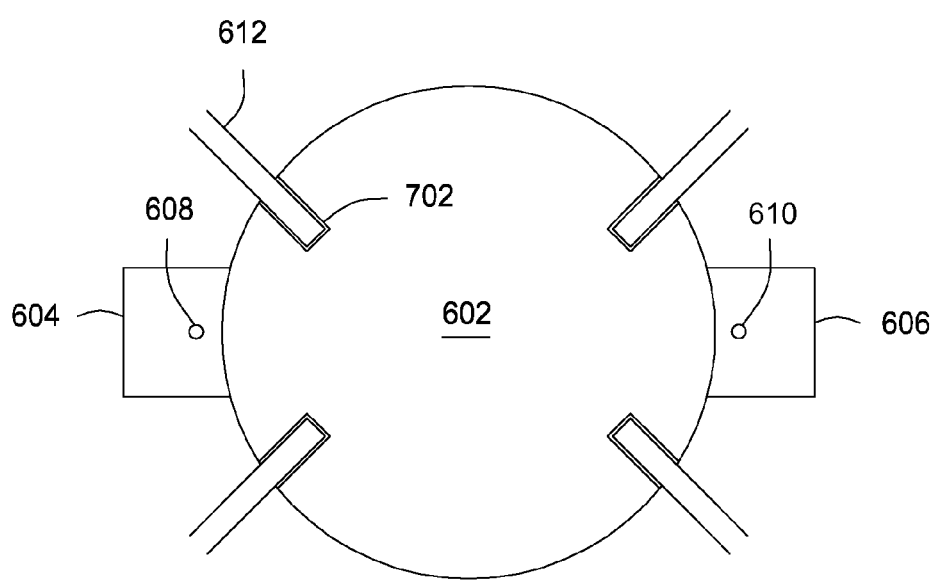
FIG. 7 is a top view of the multi-substrate thermal management apparatus of FIG. 6.

The multi-substrate thermal management apparatus 600 includes a lift assembly with a plurality of prongs 612 to facilitate placement and removal of the substrates onto or from the plates 602. As shown in FIG. 7, the plurality of prongs 612 are lowered into corresponding recesses 702 during a heat transfer process and are raised up (as shown in FIG. 6) to lift the substrates off the plates 602 or to receive substrates.

While the foregoing is directed to embodiments of the present disclosure, other and further embodiments of the disclosure may be devised without departing from the basic scope thereof.

The invention claimed is:

1. A multi-substrate thermal management apparatus, comprising:
   a plurality of plates vertically arranged above one another and spaced apart to enable a substrate to be raised off of or lowered onto an upper surface of each of the plurality of plates;
   a plurality of channels extending through each of the plurality of plates;
   a supply manifold including a supply channel coupled to the plurality of plates at first locations; and
   a return manifold including a return channel coupled to the plurality of plates via a plurality of legs at second locations, wherein the supply and return channels are fluidly coupled to the plurality of channels to flow a heat transfer fluid through the plurality of plates, and wherein the plurality of legs includes a plurality of channels fluidly coupled to the plurality of channels in the plurality of plates, and wherein diameters of the plurality of channels in the plurality of legs decrease from a leg furthest from a fluid source to a leg nearest the fluid source.

2. The multi-substrate thermal management apparatus of claim 1, wherein each of the plurality of plates includes a plurality of contact elements on an upper surface to support a substrate thereon.

3. The multi-substrate thermal management apparatus of claim 2, wherein the plurality of contact elements includes 41 contact elements.

4. The multi-substrate thermal management apparatus of claim 2, wherein the plurality of contact elements are formed of silicon nitride (SiN).

5. The multi-substrate thermal management apparatus of claim 2, wherein the plurality of contact elements have a height of about 0.007 inches from an upper surface of each the plurality of plates.

6. The multi-substrate thermal management apparatus of claim 2, wherein the plurality of contact elements are equally distributed around each of the plurality of plates.

7. The multi-substrate thermal management apparatus of claim 1, wherein the diameters of the plurality of channels in the plurality of legs decrease from about 0.1875 inches at the uppermost leg to about 0.1495 inches at the lowermost leg.

8. The multi-substrate thermal management apparatus of claim 1, wherein each of the plurality of plates has a thickness between about 0.38 inches and 0.5 inches.

9. The multi-substrate thermal management apparatus of claim 1, further comprising:
   a plurality of pins extending from an upper surface of each of the plurality of plates,
   wherein when a substrate is disposed atop the plate, the plurality of pins surround the substrate to prevent sliding of the substrate.

10. The multi-substrate thermal management apparatus of claim 1, further comprising:
    a lift assembly including a plurality of prongs which extend through a corresponding plurality of notches in a periphery of the plurality of plates to lift a substrate off of an upper surface of the plate.

11. An apparatus for processing a substrate, comprising:
    a factory interface for interfacing with a substrate processing platform, the factory interface including a docking station and a factory interface robot to facilitate transfer of substrates from the factory interface to the substrate processing platform;
    a multi-substrate thermal management apparatus disposed between the factory interface and the substrate processing platform such that the factory interface robot can place substrate into or remove substrates from the multi-substrate thermal management apparatus; and
    a heat transfer fluid supply coupled to the multi-substrate thermal management apparatus to provide a heat transfer fluid to the multi-substrate thermal management apparatus,
    wherein the multi-substrate thermal management apparatus comprises:
       a plurality of plates vertically arranged above one another;
       a plurality of channels extending through each of the plurality of plates;
       a supply manifold including a supply channel coupled to the plurality of plates at first locations; and
       a return manifold including a return channel coupled to the plurality of plates via a plurality of legs at second locations, wherein the supply and return channels are fluidly coupled to the plurality of channels to flow a heat transfer fluid through the plurality of plates.

12. The apparatus of claim 11, wherein each of the plurality of plates includes a plurality of contact elements on an upper surface to support a substrate thereon.

13. The apparatus of claim 12, wherein the plurality of contact elements includes 41 contact elements.

14. The apparatus of claim 12, wherein the plurality of contact elements are equally distributed around each of the plurality of plates.

15. The apparatus of claim 11, wherein the plurality of legs includes a plurality of channels fluidly coupled to the plurality of channels in the plurality of plates.

16. The apparatus of claim 15, wherein diameters of the plurality of channels in the plurality of legs decrease from a leg furthest from a fluid source to a leg nearest the fluid source.

17. The apparatus of claim 11, wherein the multi-substrate thermal management apparatus further comprises:
    a lift assembly including a plurality of prongs which extend through a corresponding plurality of notches in a periphery of the plurality of plates to lift a substrate off or lower the substrate onto an upper surface of the plate.

18. A multi-substrate thermal management apparatus, comprising:
    a plurality of plates vertically arranged above one another and spaced apart to enable a substrate to be raised off of or lowered onto an upper surface of each of the plurality of plates, wherein each of the plurality of plates includes 41 contact elements equally distributed on an upper surface to support a substrate thereon;
    a plurality of channels extending through each of the plurality of plates;
    a supply manifold including a supply channel coupled to the plurality of plates at first locations; and
    a return manifold including a return channel coupled to the plurality of plates via a plurality of legs at second locations,
    wherein diameters of the plurality of channels in the plurality of legs decrease from a leg furthest from a fluid source to a leg nearest the fluid source, and
    wherein the supply and return channels are fluidly coupled to the plurality of channels to flow a heat transfer fluid through the plurality of plates.

* * * * *